US008609501B2

(12) United States Patent
Tian et al.

(10) Patent No.: US 8,609,501 B2
(45) Date of Patent: Dec. 17, 2013

(54) FLUORINE IMPLANT UNDER ISOLATION DIELECTRIC STRUCTURES TO IMPROVE BIPOLAR TRANSISTOR PERFORMANCE AND MATCHING

(75) Inventors: Weidong Tian, Dallas, TX (US); Ming-Yeh Chuang, McKinney, TX (US); Rajni J. Aggarwal, Garland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/451,355

(22) Filed: Apr. 19, 2012

(65) Prior Publication Data

US 2013/0065374 A1    Mar. 14, 2013

Related U.S. Application Data

(60) Provisional application No. 61/532,845, filed on Sep. 9, 2011.

(51) Int. Cl.
*H01L 21/331* (2006.01)
(52) U.S. Cl.
USPC .................................. 438/312; 257/E21.379
(58) Field of Classification Search
USPC ........... 438/312, 318, 369, 377; 257/E21.379
See application file for complete search history.

(56) References Cited

U.S. PATENT DOCUMENTS

| 5,047,357 A | 9/1991 | Eklund |
| 6,706,606 B2 | 3/2004 | Romas, Jr. et al. |
| 7,144,787 B2 * | 12/2006 | Dokumaci et al. ............ 438/312 |
| 8,012,842 B2 | 9/2011 | Balster et al. |
| 2007/0249135 A1 | 10/2007 | Chuang et al. |
| 2010/0308416 A1 | 12/2010 | El-Kareh et al. |

OTHER PUBLICATIONS

Goto et al., "A Triple Gate Oxide CMOS Technology Using Fluorine Implant for System-on-a-Chip", Digest of Technical Papers: 2000 Symposium on VLSI Technology (IEEE, 2000), pp. 148-149.
Lin et al., "The Effect of Flouroine on MOSFET Channel Length", Electron Device Letters, vol. 14, No. 10 (IEEE, 1993), pp. 469-471.
U.S. Appl. No. 13/312,304, filed Dec. 6, 2011, entitled "Improved on Current in One-Time Programmable Memory Cells".

* cited by examiner

*Primary Examiner* — Quoc Hoang
(74) *Attorney, Agent, or Firm* — Jacqueline J. Garner; Wade J. Brady, III; Frederick J. Telecky, Jr.

(57) ABSTRACT

A method of fabricating an integrated circuit including bipolar transistors that reduces the effects of transistor performance degradation and transistor mismatch caused by charging during plasma etch, and the integrated circuit so formed. A fluorine implant is performed at those locations at which isolation dielectric structures between base and emitter are to be formed, prior to formation of the isolation dielectric. The isolation dielectric structures may be formed by either shallow trench isolation, in which the fluorine implant is performed after trench etch, or LOCOS oxidation, in which the fluorine implant is performed prior to thermal oxidation. The fluorine implant may be normal to the device surface or at an angle from the normal. Completion of the integrated circuit is then carried out, including the use of relatively thick copper metallization requiring plasma etch.

20 Claims, 12 Drawing Sheets

FLUORINE IMPLANT UNDER ISOLATION DIELECTRIC STRUCTURES TO IMPROVE BIPOLAR TRANSISTOR PERFORMANCE AND MATCHING

CROSS-REFERENCE TO RELATED APPLICATIONS

This application claims priority, under 35 U.S.C. §119(e), of Provisional Application No. 61/532,845, filed Sep. 9, 2011, incorporated herein by this reference.

STATEMENT REGARDING FEDERALLY SPONSORED RESEARCH OR DEVELOPMENT

Not applicable.

BACKGROUND OF THE INVENTION

This invention is in the field of the manufacture of semiconductor integrated circuits. Embodiments of this invention are more specifically directed to the fabrication of isolation structures at the locations of bipolar transistors in semiconductor integrated circuits.

As fundamental in the art, an important parameter related to the performance of bipolar junction transistors is the common-emitter current gain, or forward-active current gain. This parameter is commonly symbolized as $\beta$ or $\beta_F$, according to the Ebers-Moll model terminology; in the h-parameter model terminology, the bipolar transistor current gain is referred to as $h_{FE}$. This current gain $h_{FE}$ is calculated as the ratio of the collector current ($I_C$) to the base current ($I_B$) of the transistor when biased in the forward-active region (i.e., base-emitter junction forward biased, and collector-base junction strongly reverse-biased). This gain parameter thus essentially reflects the amplification effect of the transistor—a small change in the base current causes a proportionally larger change in the collector current, with $h_{FE}$ as the proportionality constant. Larger values of $h_{FE}$ are thus generally desirable for high performance circuits.

Another important measure relevant to bipolar transistor circuit behavior is the base-emitter voltage ($V_{BE}$) of the transistor at a given collector current, in forward-active operation. Certain circuit arrangements, such as current mirrors and differential amplifiers, rely on matched performance of transistors relative to one another. A difference in $V_{BE}$ between paired transistors can establish an undesired offset voltage; in the context of a current mirror, the $V_{BE}$ offset appears as non-ideal matching of the collector currents of the mirror transistors (their bases being connected together).

As known in the art, bipolar transistor parameters, including forward-active current gain $h_{FE}$ and base-emitter voltage $V_{BE}$, are affected by a number of design and manufacturing factors. Design factors include the desired dopant concentration in the emitter, base, and collector regions of the transistor, the desired physical dimensions of these regions, and the like. Physical factors also affect the variance of the transistor structure, as manufactured, from the transistor as designed, which is reflected in the transistor electrical parameters, including in the $h_{FE}$ and $V_{BE}$ values.

In many cases, the variance of the performance of a transistor as manufactured, from that expected of the transistor as designed, can be causally attributed to particular manufacturing processes. For example, variation in the implant dose and energy generally results in a predictable change in the dopant concentration and profile of the implanted region. However, the causal relationship between a manufacturing process and the resulting transistor performance parameter is not readily apparent in some cases. In some cases, the causal relationship between a process change and a widespread degradation in transistor performance can be quite puzzling.

It has been observed, in connection with this invention, that the $h_{FE}$ values of bipolar transistors in which one or more conductor levels overlying the bipolar transistors are formed of copper is significantly degraded, as compared with the $h_{FE}$ values of similar transistors for which aluminum is the metallization. It has also been observed, in connection with this invention, that the standard deviation of the $h_{FE}$ and $V_{BE}$ values of a population of bipolar transistors with copper metallization is significantly greater than the corresponding standard deviation of those values for transistors with aluminum metallization, indicating increased variation among transistors with copper metallization.

Degradation of transistor performance and increased variation in operating parameters are, of course, undesirable. However, some circuits are especially vulnerable to mismatch in device parameters among transistors within the same integrated circuit. As mentioned above, circuit mirrors and differential amplifiers are examples of circuits that rely on good matching of bipolar transistors with one another for optimum operation. A common measure of transistor mismatch is the standard deviation of the difference in a given parameter between pairs of transistors. For example, the standard deviation of the offset voltage ($|V_{BE1}-V_{BE2}|$) between two current mirror transistors in a population of current mirrors is a measure of the degree of device mismatch in that population, with smaller standard deviation desirable for stable and accurate circuit performance. It has been observed that the implementation of copper metallization not only degrades the circuit performance of bipolar transistors due to reduced transistor gain as mentioned above, but also increases transistor mismatch (in both the $h_{FE}$ and $V_{BE}$ values) among bipolar transistors in the same circuit.

By way of further background, the ion implantation of fluorine into the active regions of metal-oxide-semiconductor (MOS) transistors is known. Lin et al., "The Effect of Fluorine on MOSFET Channel Length", *Elec. Device Letters*, Vol. 14, No. 10 (IEEE, October 1993), pp. 469-71, incorporated herein by reference, describes the implantation of fluorine into the source and drain regions of MOS transistors (i.e., specifically into the "lightly-doped drain" implanted regions) after formation of the polysilicon gate electrode; this paper reports that the fluorine results in a smaller channel length reduction, by retarding phosphorous lateral diffusion. Goto et al., "A Triple Gate Oxide CMOS Technology Using Fluorine Implant for System-on-a-Chip", *Digest of Technical Papers: 2000 Symposium on VLSI Technology*, Paper 15.3 (IEEE, 2000), pp. 148-49, describes the implantation of fluorine into the low power CMOS active region, prior to formation of the gate oxide and gate electrode, to reduce gate leakage current.

BRIEF SUMMARY OF THE INVENTION

Embodiments of this invention provide a method of fabricating bipolar transistors in an integrated circuit, and the transistors so fabricated, in which the forward-active current gain is increased over that of conventional bipolar transistors.

Embodiments of this invention provide such a method and transistors in which the forward-active current gain is not affected by subsequent plasma etching processes.

Embodiments of this invention provide such a method and transistors in which the performance of a population of bipolar transistors in the same integrated circuit are more closely matched than when constructed according to conventional processes.

Embodiments of this invention provide such a method and transistors in which the electrical characteristics of other transistors, such as metal-oxide-semiconductor (MOS) logic transistors and the like, are essentially unaffected by the construction of the bipolar transistors.

Other objects and advantages of this invention will be apparent to those of ordinary skill in the art having reference to the following specification together with its drawings.

Embodiments of this invention may be implemented into an integrated circuit including bipolar transistors, in which the base and emitter regions are isolated from one another by one or more isolation dielectric structures. A masked fluorine implant is applied to the silicon surface at the locations of the isolation structures. For the case of shallow trench isolation structures, the fluorine implant is applied prior to the filling of those trenches with dielectric material; for the case of isolation structures formed by way of local oxidation of silicon (LOCOS), the fluorine implant is applied to the moat regions of the bipolar transistor area, prior to oxidation. The fluorine implant at the interface between the isolation dielectric structure and the underlying silicon is believed to seal charge trapping sites that otherwise require a component of base current to charge and de-charge during transistor operation.

BRIEF DESCRIPTION OF THE SEVERAL VIEWS OF THE DRAWING

FIG. 2a is a plan view.

DETAILED DESCRIPTION OF THE INVENTION

This invention will be described in connection with its embodiments, namely as implemented into a process of fabricating a silicon integrated circuit including bipolar transistors, as it is contemplated that this invention is especially beneficial in such an application. It is further contemplated, however, that this invention may be beneficially applied to the fabrication of a wide range of integrated circuits beyond those described herein. Accordingly, it is to be understood that the following description is provided by way of example only, and is not intended to limit the true scope of this invention as claimed.

Figure 1:
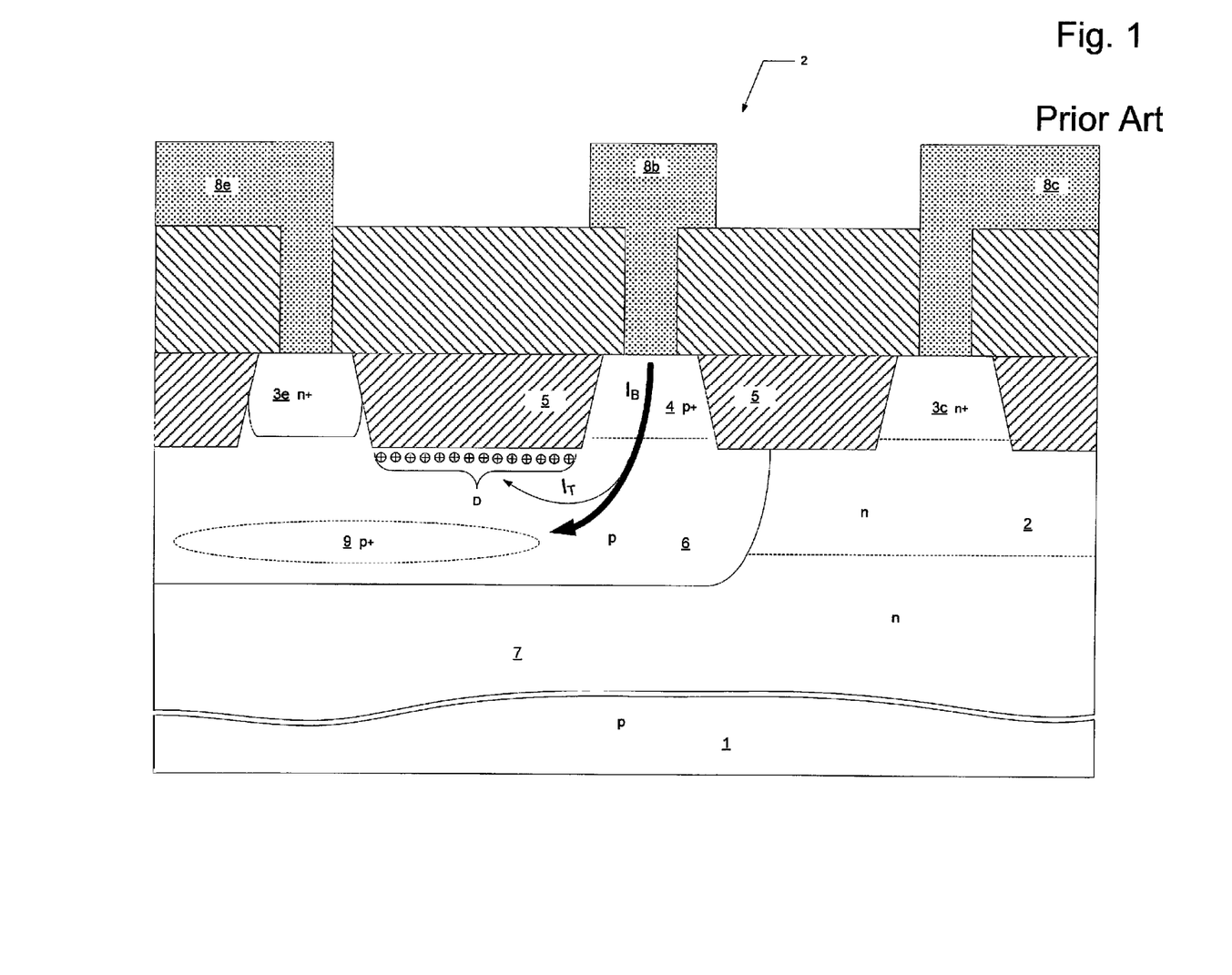
FIG. 1 is a cross-sectional view of a conventional bipolar transistor structure.

FIG. 1 illustrates, in cross-section, the structure of conventional n-p-n bipolar transistor 2. In this conventional construction, transistor 2 is formed at the surface of a silicon substrate, with metal conductors 8e, 8b, 8c serving as the transistor emitter, base, and collector electrodes. In this vertical n-p-n construction, conductor 8e makes contact to heavily-doped n-type (n+) region 3e, which is disposed at the surface of p-type well 6; conductor 8c is in contact with n+ region 3c, disposed at the surface of n-type well 3. Both of p-type well 6 and n-type well 2 overlie deep n-type well 7, which itself overlies p-type substrate 1 in this construction. Conductor 8b is in contact with p+ region 4, which is formed at the surface of p-type well 6. Heavily doped regions 3, 4 are separated from one another at the surface of the structure by isolation dielectric structures 5, constructed in this case as shallow trench isolation structures formed of silicon dioxide. P-type buried layer 9 is a more heavily doped region formed within p-type well 6, at a depth underlying emitter n+ region 3e and extending toward base p+ region 4.

For forward bias operation of transistor 2, a positive bias voltage is applied at collector conductor 8c relative to emitter conductor 8e, and base current $I_B$ is applied to base conductor 8b. Under these bias conditions, emitter n+ region 3e emits electrons into the base region constituted by p-type well 6 and p-type buried layer 9, the large proportion of which are swept into the n-type collector of deep n-well 7, n-well 12, and collector n+ region 3 and constitute collector current appearing at collector conductor 8c. The forward-active current gain $h_{FE}$ corresponds to the ratio of this collector current to base current $I_B$. Because a portion of base current $I_B$ is consumed by hole-emitter recombination in the base region, forward-active current gain $h_{FE}$ is a finite value, but is desired to be as large as possible for best circuit performance.

It has been discovered, according to this invention, that the forward-active current gain $h_{FE}$ is undesirably degraded in transistor 2, of this conventional construction, by certain manufacturing processes. More specifically, it has been discovered, according to this invention, that the plasma etching processes defining metal conductors 8e, 8b, 8c degrade $h_{FE}$ values in these devices, particularly in the case of relatively thick (on the order of 3μ) copper metallization. It is believed that this degradation results from plasma charging of the semiconductor surface during the plasma etch of the metal layer forming conductors 8e, 8b, 8c, causing charge trapping sites at the underside of isolation dielectric structures 5. These charge trapping sites are particularly deleterious at the instance of isolation dielectric structure 5 between base p+ region 4 and emitter n+ region 3e, as shown by charge trapping sites D in FIG. 1. In operation of transistor 2, the trapping and de-trapping of charge at these charge trapping sites D effectively adds a defect component $I_T$ to base current $I_B$. In other words, charge trapping sites D divert a portion of base current $I_B$, requiring additional base current to support a given level of collector current, as compared to transistors without this defect. The forward-active current gain $h_{FE}$ is thus degraded as a result of charge trapping sites D.

It has also been discovered that the formation of these charge trapping sites D is essentially a random process. As such, an increase in the number of these charge trapping sites D is typically accompanied by an increase in the variation of charge trapping from transistor to transistor. As such, the increase in charge trapping sites D due to plasma charging not only degrades $h_{FE}$ values of the transistors, but also increases the mismatch in $h_{FE}$ and $V_{BE}$ values among bipolar transistors in the same circuit (i.e., increases the variation of the difference in $h_{FE}$ and $V_{BE}$ between paired transistors in the circuit). As such, these conventional devices exhibit both degraded performance and increased device mismatch. These effects thus result in poorer overall circuit performance, necessitating more complex and thus more costly design techniques to attain the desired performance.

Figure 2A:
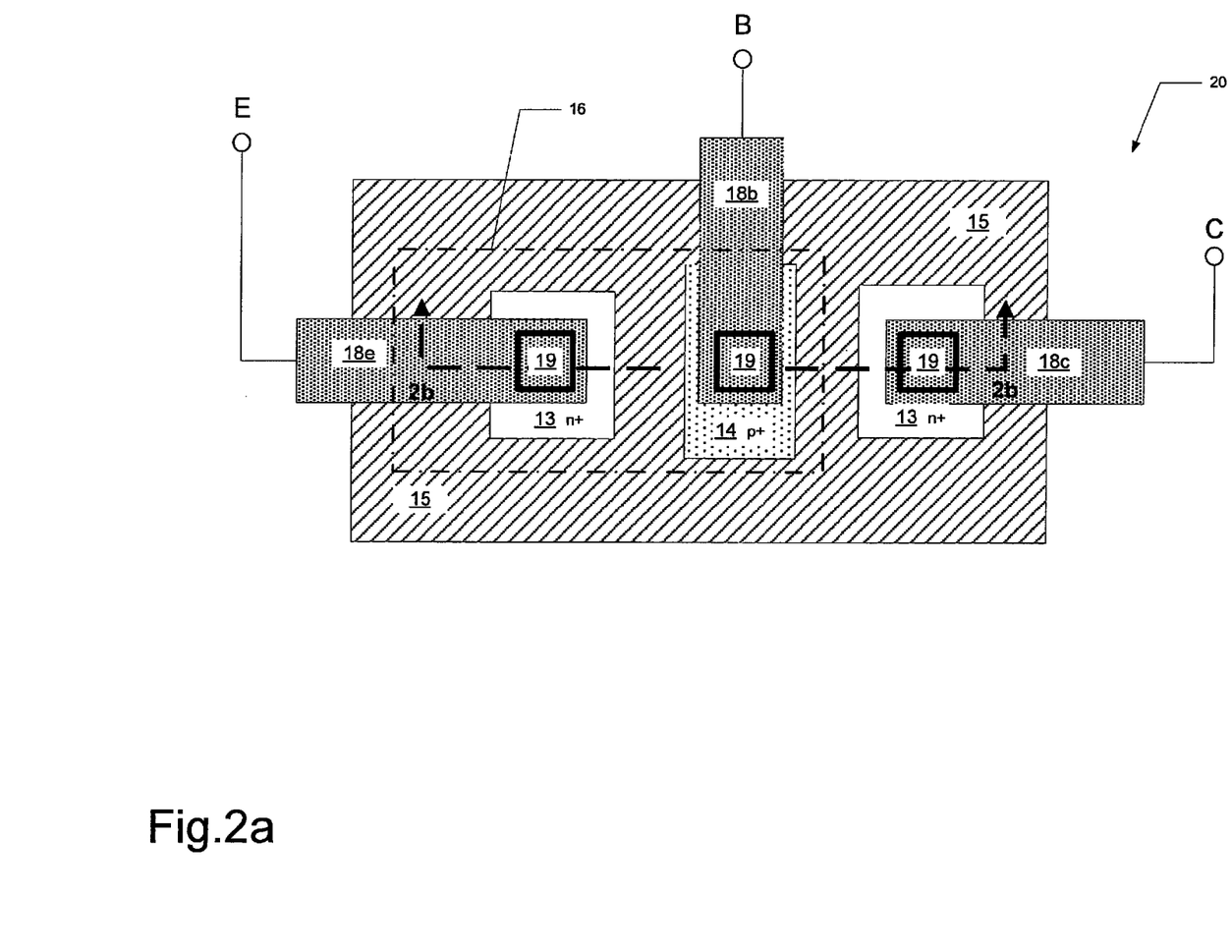

Referring now to FIGS. 2a and 2b, n-p-n bipolar transistor 20 constructed according to an embodiment of this invention, in which this $h_{FE}$ degradation mechanism is addressed, will now be described. In the generic plan view of FIG. 2a, isolation dielectric 15 defines the locations of active semiconductor regions including emitter n+ region 13e, collector n+ region 13c, and base p+ region 14. FIG. 2a also shows metal conductors 18e, 18b, 18c extending over the surface of the structure and making electrical contact to n+ region 13e, p+ region 14, and n+ region 13c, respectively, via contact openings 19 through an interlevel dielectric layer or layers (not shown) in the conventional manner. Metal conductors 18e, 18b, 18c serve as the emitter E, base B, and collector C of transistor 20, as suggested by FIG. 2a.

Of course, the layout of transistor 20 may vary widely from that shown in FIG. 2a. It is contemplated that the generic arrangement shown in FIG. 2a (as well as in FIG. 2b, described below) is provided as an illustrative example only, and is not intended to limit the construction of transistors according to embodiments of this invention. For example, while isolation dielectric structure 15 is shown in FIG. 2a as a contiguous structure, separate isolation dielectric structures 15 may alternatively be constructed within transistor 20, for example if neighboring transistors 20 share common collector or base regions. As a further alternative, transistor 20 may be constructed as a p-n-p bipolar transistor if desired.

Figure 2B:
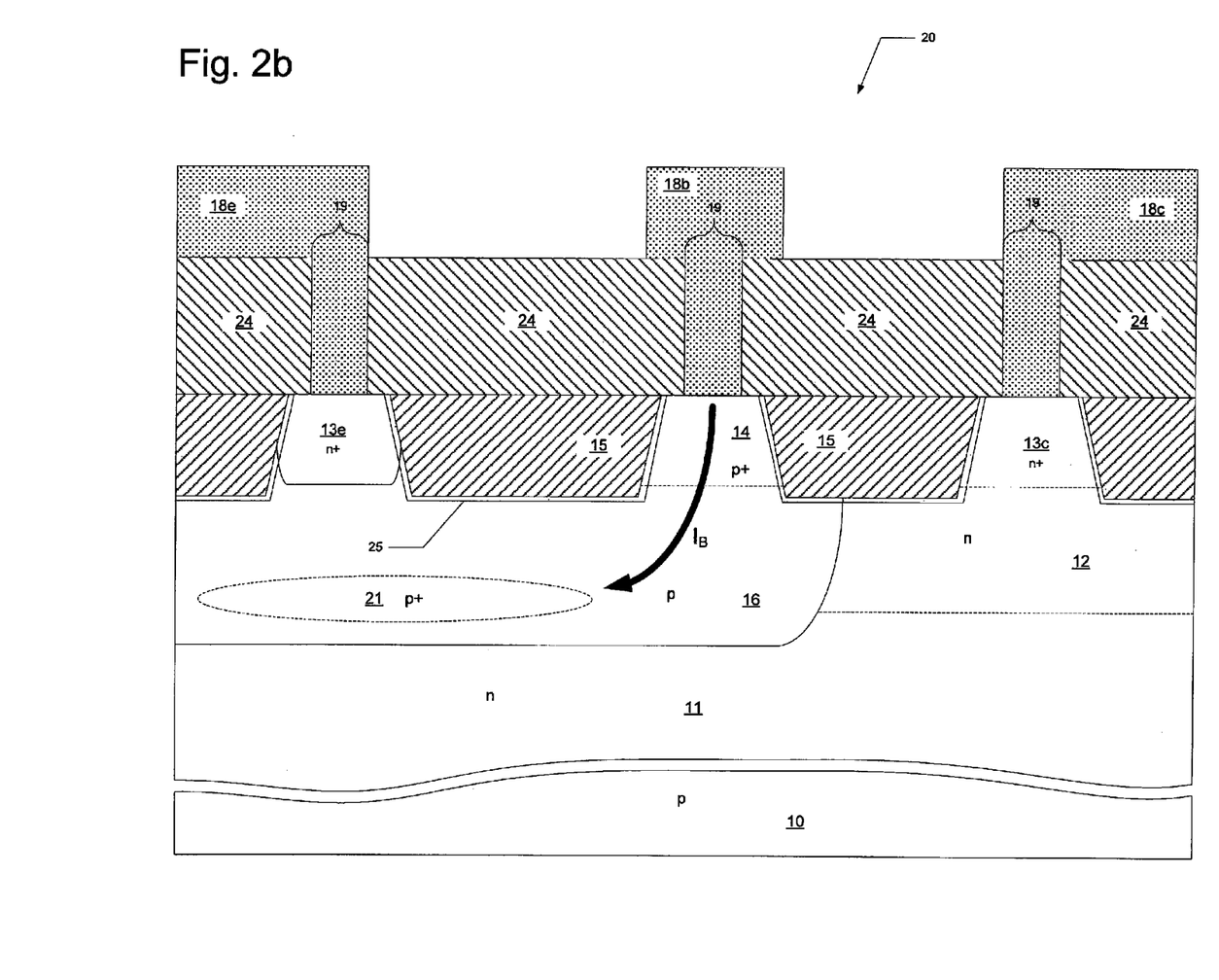
FIG. 2b is a cross-sectional view, of a bipolar transistor structure constructed according to an embodiment of the invention.

FIG. 2b illustrates the structure of transistor 20 in cross-section. As shown in FIG. 2b, transistor 20 is formed at a semiconductor surface of a body that includes p-type substrate 10 in this example. Deep n-well 11 is disposed within p-type substrate 10. P-type well 16 overlies deep n-well 11 in the location of the eventual base (and emitter) of transistor 20, formed of either an epitaxial silicon layer grown at the surface of deep n-well 11 or by implant and diffusion of dopant into the surface. N-type well 12 is disposed above and in physical contact with deep n-well 11 in the location of the collector of transistor 20. Emitter n+ region 13e and collector n+ region 13c are disposed at selected locations of the surface of p-type well 16 and n-type well 12, respectively; similarly, base p+ region is disposed at a selected location of the surface of p-type well 16. According to this embodiment of the invention, the construction of bipolar transistor 20 is compatible with the manufacturing processes involved in constructing metal-oxide-semiconductor (MOS) transistors elsewhere in the same integrated circuit. For example, the ion implantation and diffusion of n+ regions 13e, 13c and p+ region 14 can be of the same dopant type and concentration as source and drain regions of n-channel and p-channel MOS transistors, respectively, elsewhere in the integrated circuit. P+ buried layer 21 is provided at locations of p-type well underlying emitter n+ region 13e and extending into p-type well 16, to provide reduced base resistance.

At the surface of the semiconductor, n+ regions 13e, 13c and p+ region 14 are separated from one another by isolation dielectric structures 15. In this embodiment of the invention, isolation dielectric structures 15 are so-called "shallow trench isolation" structures, and as such are recessed into the surface of the semiconductor at selected locations, so as to be essentially flush with that surface. One or more layers of dielectric material, forming interlevel dielectric 24, are disposed over the surface of isolation dielectric structures 15 and the active regions at which n+ regions 13e, 13c and p+ region 14 are formed. Interlevel dielectric 24 may consist of one or more types of insulating material, including for example silicon nitride, silicon dioxide, or a combination thereof, an organic dielectric material such as SiLK, or the like. The particular composition of interlevel dielectric 24 can vary, depending on the implementation and on the process requirements. Contact openings 19 are etched through interlevel dielectric 24 at the desired locations. Metal conductors 18e, 18b, 18c are disposed within these contact openings 19, either as a unitary portion of the overlying electrodes themselves, or as the combination of a plug (and accompanying liner layer) disposed within contact openings 19 through interlevel dielectric 24, to which the overlying laterally-extending conductors 18 make physical and electrical contact. In this embodiment of the invention, whether including the portions disposed within contact openings 19 or only constituting the laterally-extending electrodes, metal conductors 18e, 18b, 18c may comprise a relatively thick (e.g., on the order of 3μ thick) layer of copper or an alloy including copper.

The operation of bipolar transistor 20 of FIGS. 2a and 2b corresponds to that described above relative to transistor 2 of FIG. 1. To summarize, forward bias operation of transistor 20 occurs upon a positive bias voltage being applied at collector conductor 18c relative to emitter conductor 18e, in combination with base current $I_B$ being applied to base conductor 18b. The forward bias of the base-emitter junction and supply of majority carriers into the base region of p-type well 16 (and p+ buried layer 21) causes emitter n+ region 13e to emits electrons into the base region, most of those electrons being swept into the n-type collector of deep n-well 11, n-type well 12, and collector n+ region 13c by the action of the reverse-biased collector-base junction. The ratio of the resulting collector current to base current $I_B$ is the forward-active current gain $h_{FE}$ of transistor 20.

In this embodiment of the invention, as mentioned above, isolation dielectric structures 15 are shallow trench isolation structures, formed by way of etching trenches into the silicon surface, followed by deposition of a dielectric material such as silicon dioxide into those trenches. This method of forming isolation structures for transistors in integrated circuits is known in the art. According to embodiments of this invention, however, fluorine ions are implanted into the trenches, prior to the deposition of the filler dielectric material to complete isolation dielectric structures 15. The implanted fluorine ions are contemplated to affect the portions of the underlying silicon, for example at regions 25 as shown in FIG. 2b.

It is believed, in connection with this invention, that these implanted fluorine ions effectively "seal" silicon-oxide interface dangling bonds that may form trapping sites during long duration plasma etch processes, such as required to etch copper metal conductors 18e, 18b, 18c. With these charge trapping sites sealed by the implanted fluorine, charge is not trapped (nor is trapped charge de-trapped) at beneath the instance of isolation dielectric structure 15 between base p+ region 14 and emitter n+ region 13e, as described above in connection with conventional transistor 2 of FIG. 1. As a result, no additional component of base current is required to charge and discharge these charge trapping site. The forward-active current gain $h_{FE}$ of transistors 20 of this embodiment of the invention is thus not degraded by that mechanism, as described for the conventional transistor of FIG. 1. And because the effects of this randomly-occurring charge trapping mechanism are eliminated, the electrical characteristics of a population of bipolar transistors 20 in an integrated circuit will be more closely matched to one another, further improving circuit performance.

Figure 3:
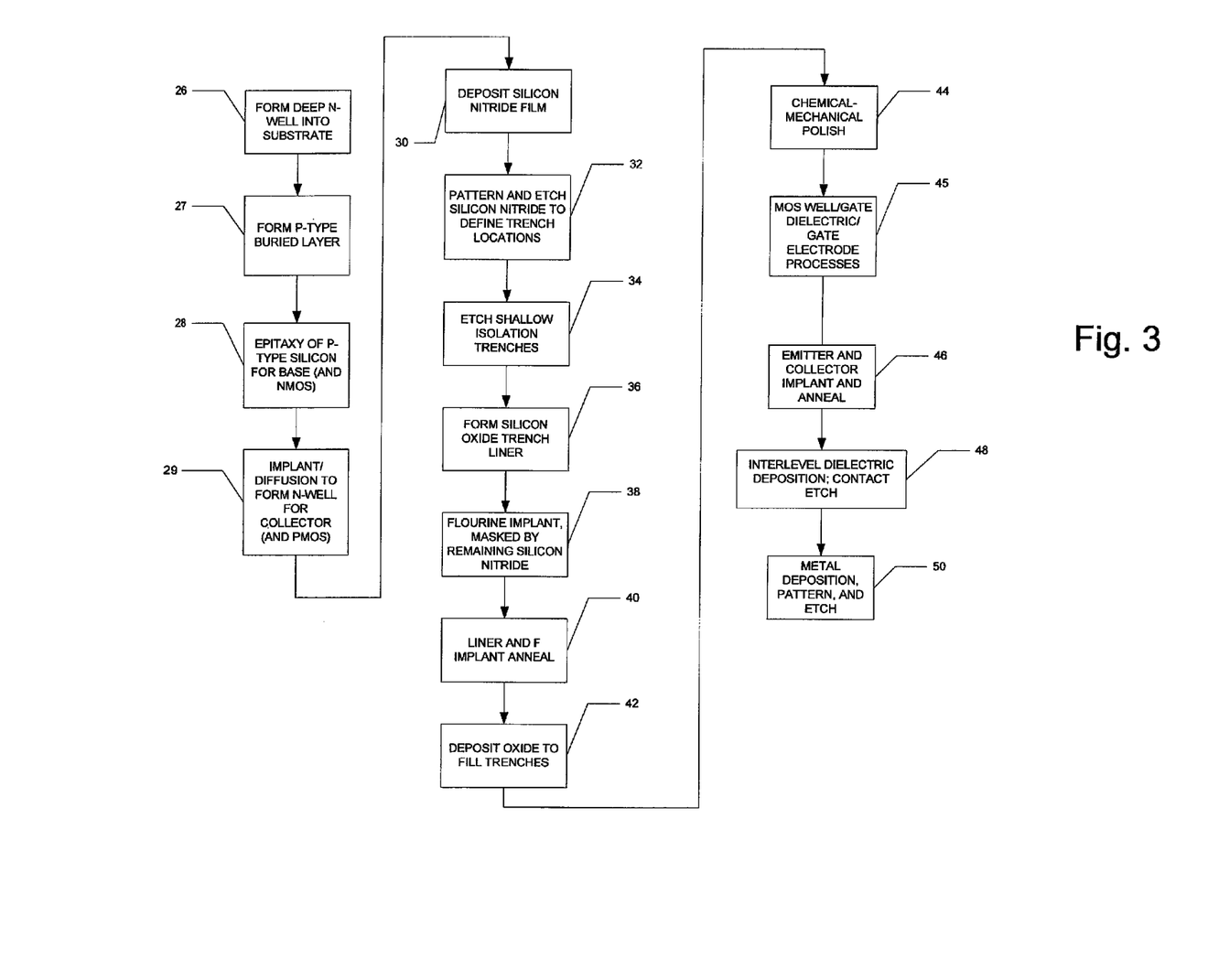
FIG. 3 is a flow diagram illustrating a process of fabricating an integrated circuit including the transistor of FIGS. 2a and 2b according to that embodiment of the invention.

Referring now to FIG. 3 in combination with the cross-sectional views of FIGS. 4a through 4f, a method of fabricating transistors 20 according to an embodiment of this invention will now be described in detail. It is of course contemplated that variations of and alternatives to the method described herein will become apparent to those skilled in the art having reference to this specification, such variations and alternatives being within the scope of this invention as claimed. And while this method of fabrication will be described in connection with a single instance of transistor 20, it is of course contemplated that multiple such transistors 20 will be simultaneously and similarly formed at the surface of the integrated circuit structure, for multiple integrated circuits in the same semiconductor wafer, as fundamental in the art.

In this embodiment of the invention, as described above in connection with FIGS. 2a and 2b, transistor 20 is formed at a surface of p-type silicon substrate 10. It is of course contemplated that other substrate types, including n-type or intrinsic substrates, silicon-on-insulator substrate structures, and the like may alternatively be used. The overall manufacturing process flow shown in FIG. 3 begins with process 26 in which deep n-well 11 is formed into substrate 10, for example by way of ion implantation and subsequent high temperature anneal. Deep n-well 11 may be formed at selected locations of substrate 10, for example by way of a masked process as conventional in the art, or as described in U.S. Patent Application Publication U.S. 2007/0249135 A1, published Oct. 25, 2007, and commonly assigned herewith. In process 27, p-type buried layer 21 is formed at a selected location within the region in which transistor 20 is being formed, at the near surface of the structure but within deep n-well 11. Process 28 then follows, by way of which a p-type doped epitaxial layer is grown from the semiconductor surface; this p-type epitaxial layer will constitute base region 16, and may also constitute the p-type regions elsewhere in the integrated circuit within which n-channel MOS transistors are subsequently formed. In process 29, n-type wells 12 are formed into selected locations of the epitaxial layer grown in process 28, such n-type wells 12 serving as the collector region of transistor 20, and also as the channel region of p-channel MOS transistors that may be formed elsewhere in the integrated circuit. The resulting structure at this stage of manufacture, following the performance of processes 26, 27, 28, 29, is shown in the cross-sectional view of FIG. 4a.

It is contemplated that the sequence in which these manufacturing processes 26, 27, 28, 29, and indeed the particular processes themselves, may vary widely from that shown in FIG. 3 up to this stage of manufacture. For example, process 29 forming the n-type wells 12 of the integrated circuit may alternatively be performed much later in the process (e.g., after formation of trench isolation dielectric structures 15) if desired. Further in the alternative, the structure of FIG. 3a may be fabricated up to this stage of manufacture without epitaxy, but by forming the various deep doped regions by conventional ion implantation into bulk silicon, and subsequent anneal. In any case, the particular manner in which the structure is fabricated up to this point can take place according to many different manufacturing techniques. In any case, the structure prior to process 30 is ready for the formation of shallow trench isolation structures 15.

Figure 4A:
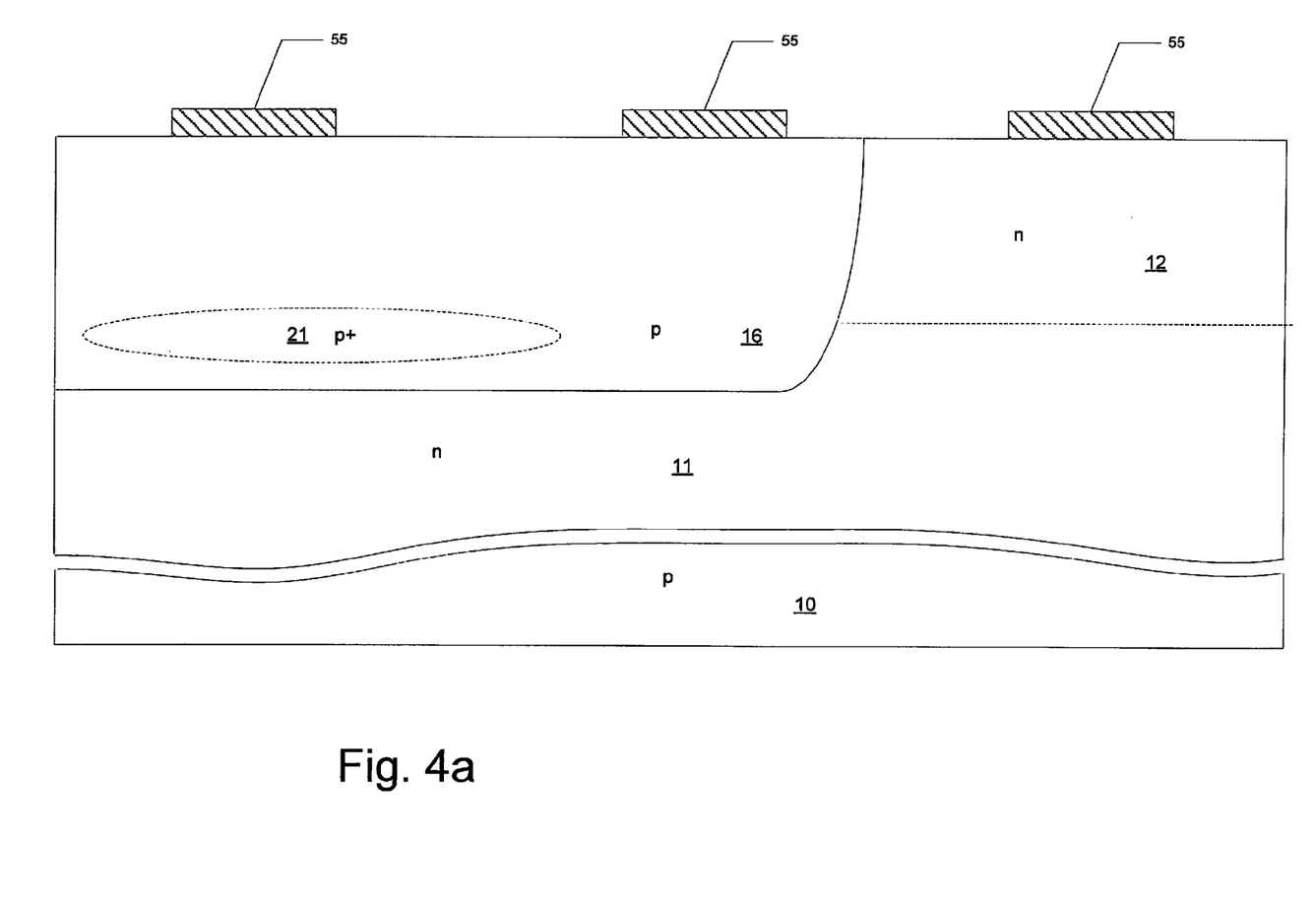
FIGS. 4a through 4f are cross-sectional views of the bipolar transistor of FIGS. 2a and 2b at various stages of the process illustrated in FIG. 3 according to that embodiment of the invention.

In process 30, a layer of silicon nitride is deposited overall, preferably to such a thickness as suitable for serving as a mask to the trench etch defining the locations of isolation dielectric structures 15. In process 32, this silicon nitride layer is photolithographically patterned and etched, exposing the semiconducting surface at those locations at which trenches are to be etched, and conversely protecting those locations of the surface of substrate 10 that are to become the active regions. FIG. 4a illustrates, in cross-section, the integrated circuit structure at this point in the fabrication process. As shown in FIG. 4a, silicon nitride layer 55 has been photolithographically patterned and etched as desired, exposing some portions of the surface of substrate 10 and remaining in place over others.

Figure 4B:
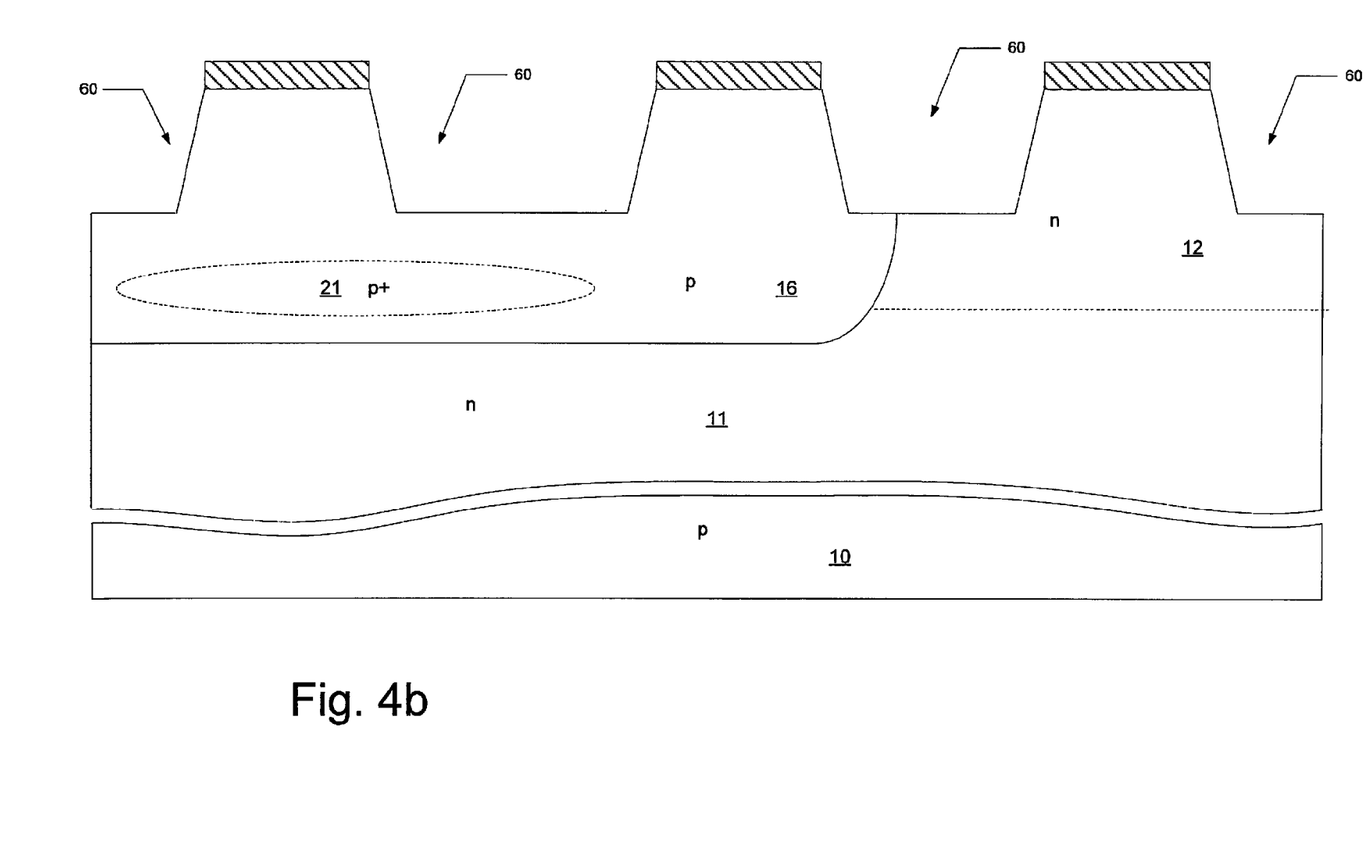
Figure 4C:
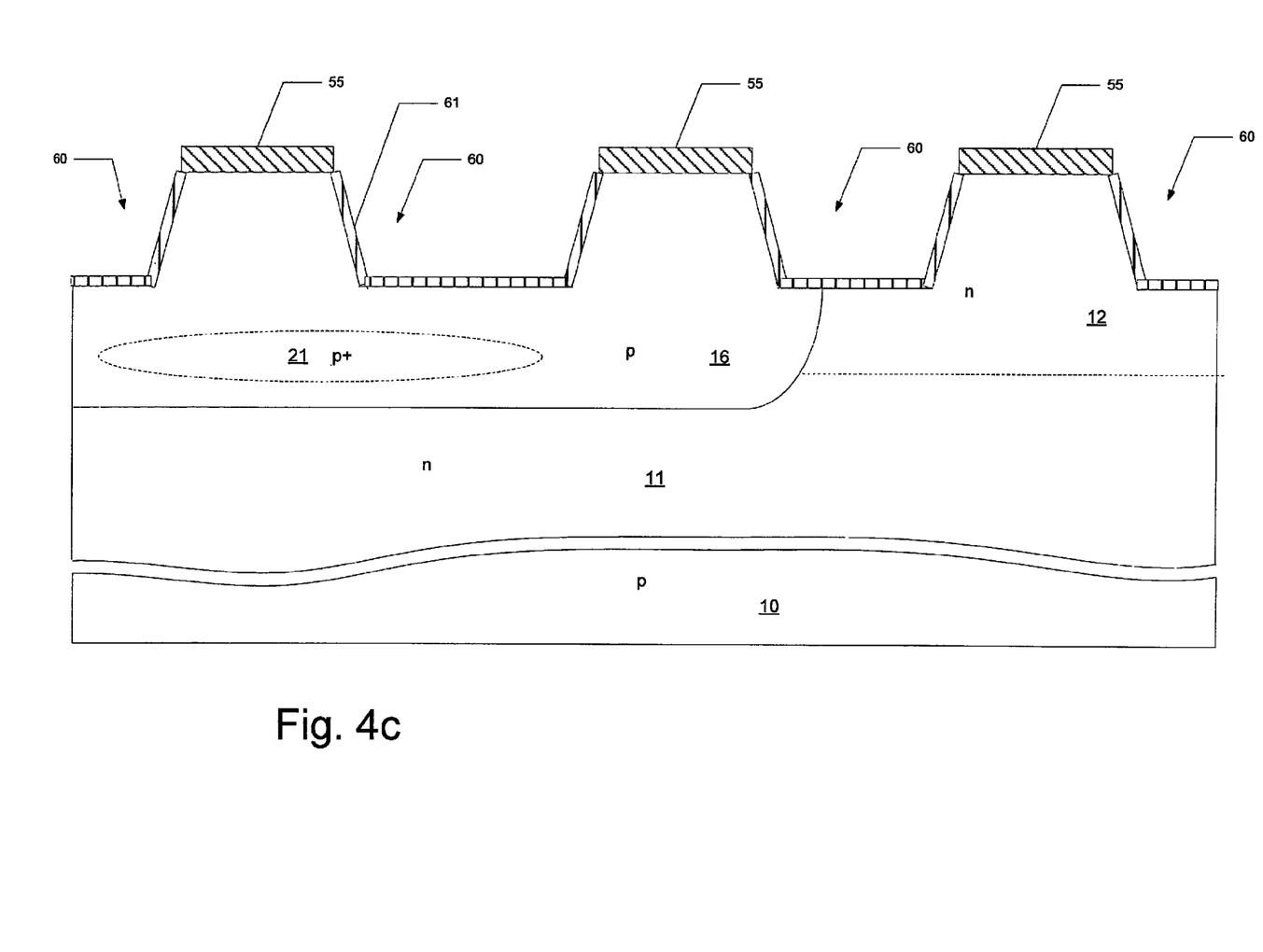

In process 34, the structure is etched to define trenches at those locations exposed by silicon nitride layer 55. The result of etch process 34 is shown in FIG. 4b, with trenches 60 etched into the surface of substrate 10 at the exposed locations. Typically, it is contemplated that trench etch process 34 will be performed by a type of plasma or "dry" etch, such that the profile of trenches 60 can be controlled as desired. In process 36, a liner layer of silicon dioxide is formed within trenches 60, for example by thermal oxidation of the exposed silicon surface within those trenches 60. Silicon nitride layer 55 at the protected surfaces of substrate 10 prevents thermal oxidation at those locations, as known in the art. FIG. 4c illustrates liner layer 61 within trenches 60; liner layer 61 is relatively thin as compared with the depth of trenches 60, as conventional in trench isolation processes.

Figure 4D:
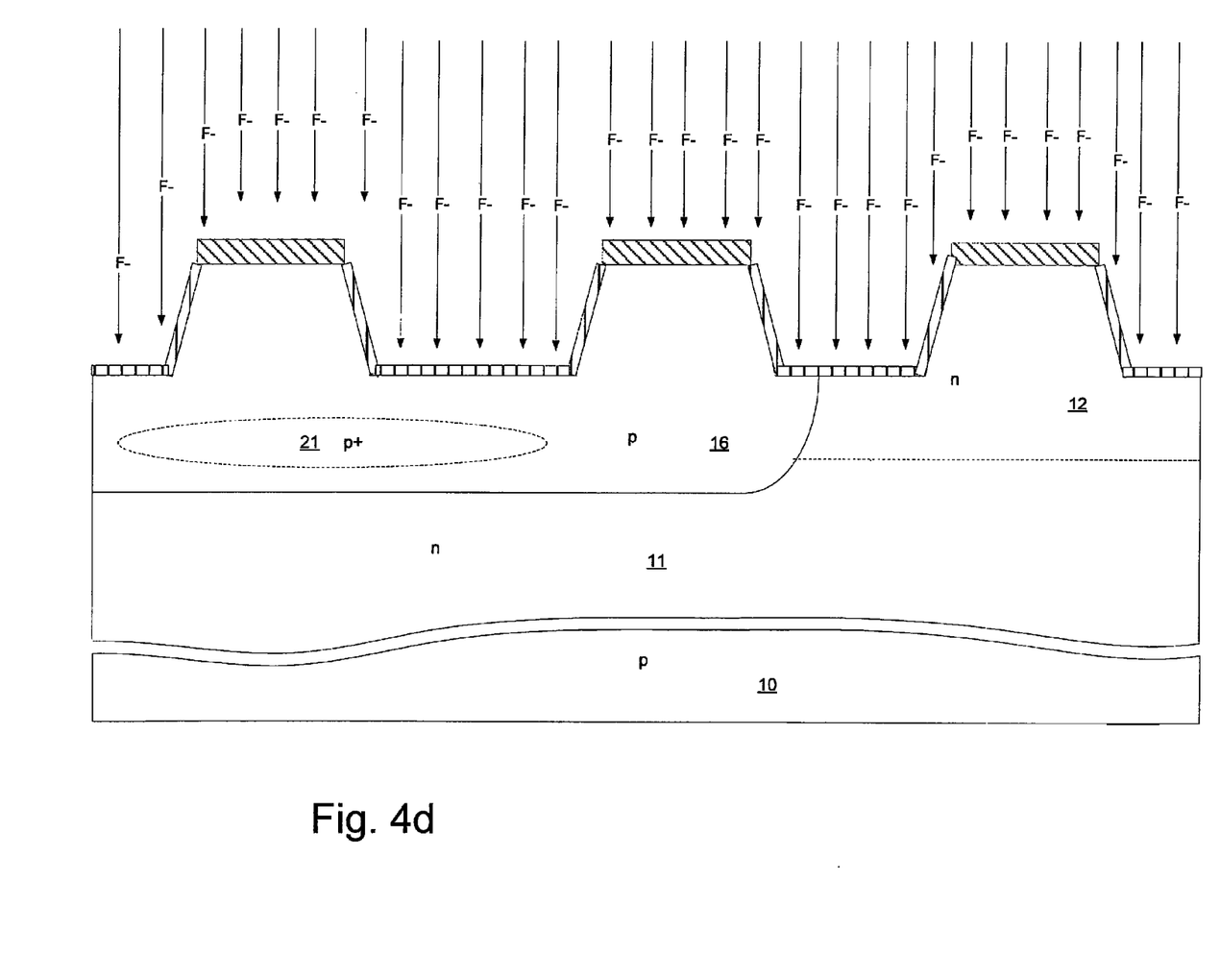
Figure 4E:
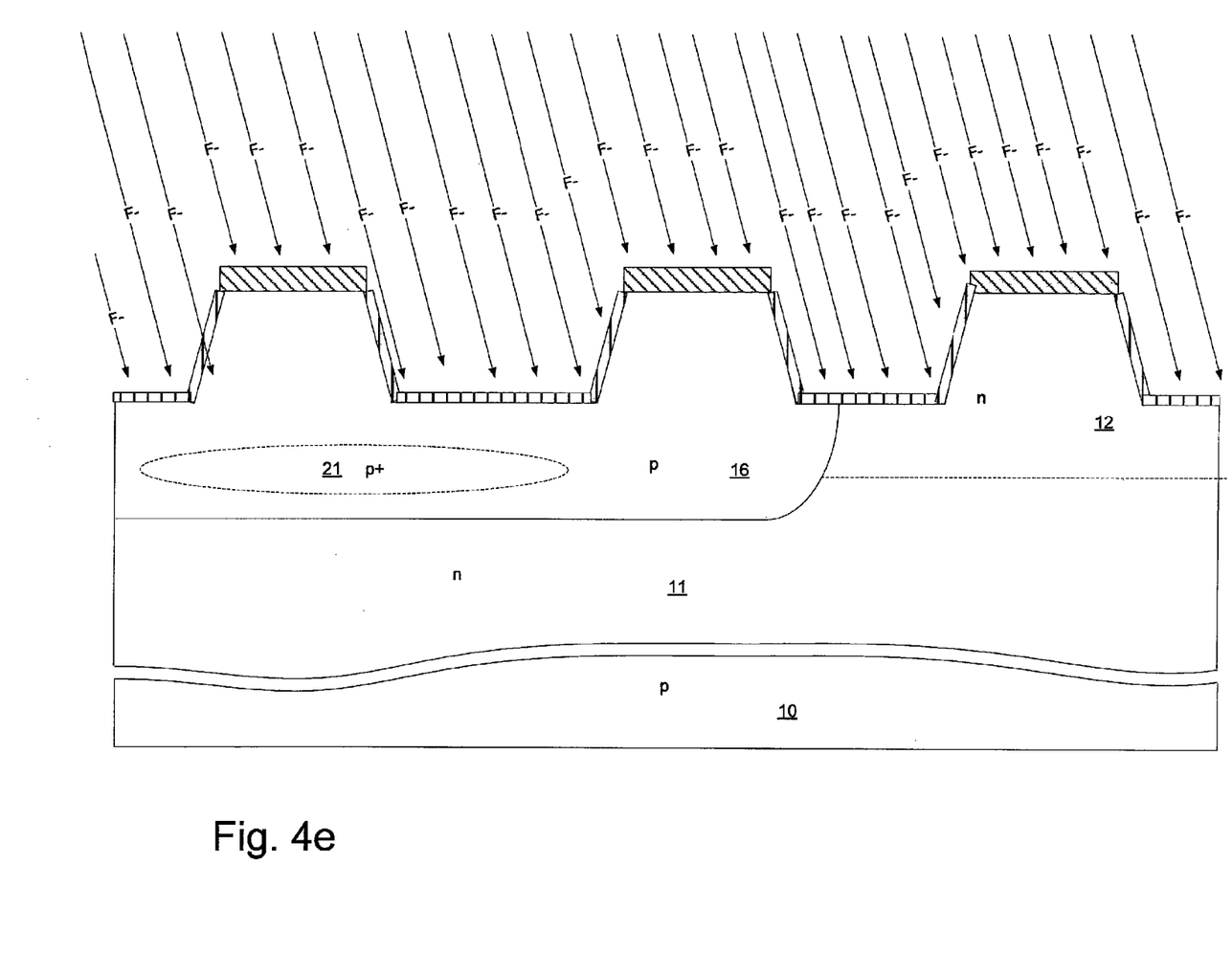
Figure 4F:
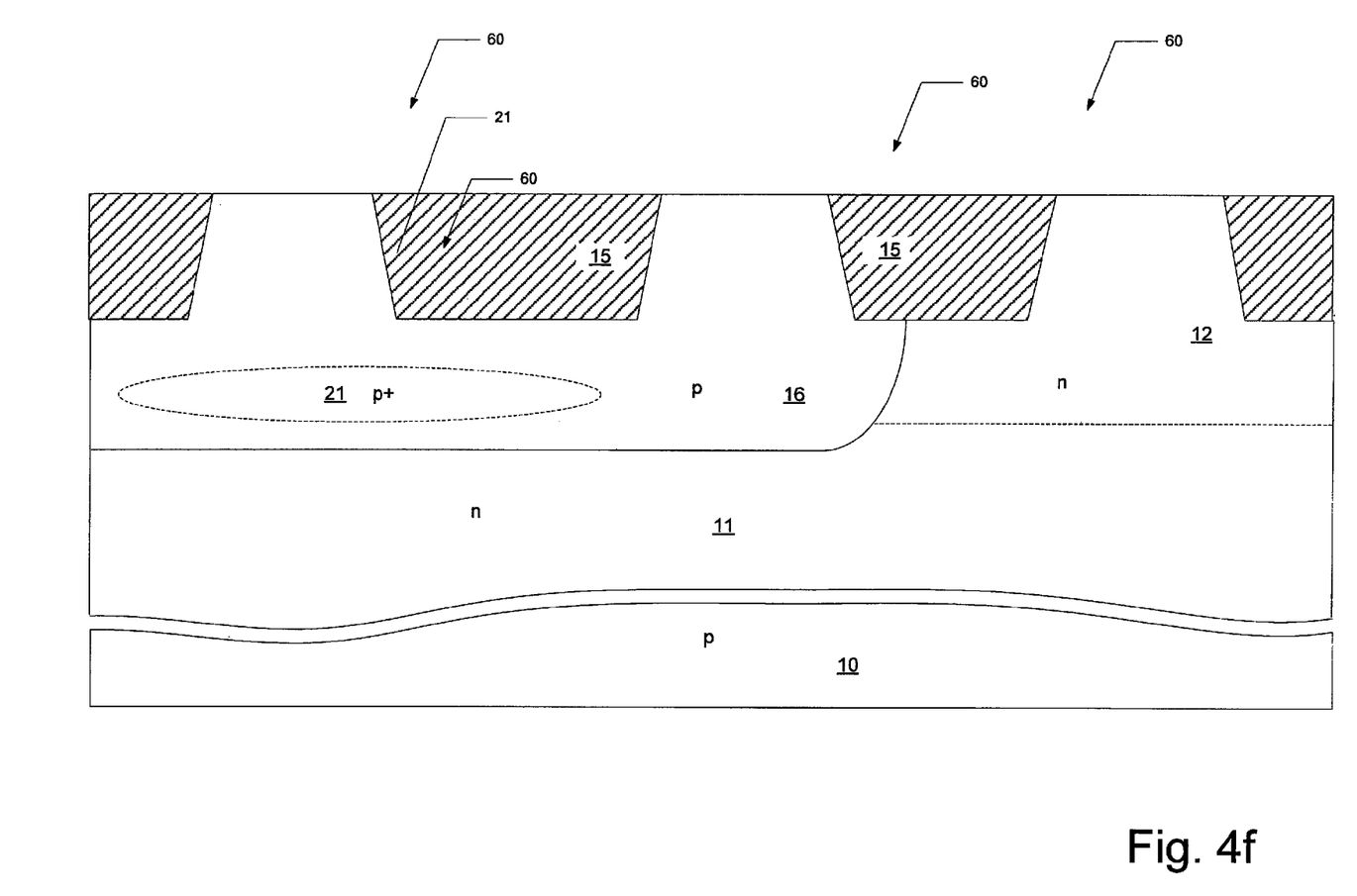

In this embodiment of the invention, trenches 60 are subjected to an ion implantation of fluorine ions in process 38. This fluorine implant is of sufficient energy to penetrate and pass through liner layer 61 when present, but is generally blocked by nitride layer 55 from impacting the active surface at those locations. The fluorine implant of process 38 may be generally in a normal direction to the surface of substrate 10 as shown in FIG. 4d, or may be at an angle (e.g., 30° to 45°) from the normal as shown in FIG. 4e, or may be a combination of the two (i.e., two separate implants, with one angled). As known in the art, the angled implant is contemplated to be performed in a rotated fashion, to uniformly implant the fluorine into the structure. One example of implant process 38 (either angled or not) implants fluorine at a dose on the order of $2 \times 10^{15}/cm^2$, at an energy on the order of 2 to 5 keV, possibly ranging as high as 10 keV.

Following the fluorine implant of process 38, the structure is annealed at a high temperature for a selected duration, as suitable for liner layer 61 and for the implanted fluorine, in process 40. This anneal may be a rapid thermal anneal (RTA) as now commonly used in the industry, or alternatively a conventional furnace anneal in an inert ambient. Following this liner and post-implant anneal, trenches 60 are filled with the dielectric material to serve as the isolation structure in process 40. For example, process 40 may be performed by chemical vapor deposition of silicon dioxide. The deposited insulator is contemplated to be sufficient to fill trenches 60 and extend above the surface of the structure (i.e., above the surface of silicon nitride layer 55. In process 42, according to this embodiment of the invention, chemical-mechanical polishing (CMP) is used to planarize the surface of the dielectric deposited in process 40 with the rest of the structure. It is contemplated that this CMP may also serve to remove silicon nitride layer 55 from the active surface, resulting in the structure shown in FIG. 4f in which isolation dielectric structures 15 have a top surface that is essentially coplanar with the semiconducting surface of substrate 10 as shown. Of course, other approaches to removing silicon nitride layer 55 and shaping the top surface of isolation dielectric structures 15 may alternatively be used.

If not previously performed, particularly if MOS transistors are also being formed in the same integrated circuit as transistor 20, n-type well 12 and any necessary p-type well (not shown) may be formed at this stage of manufacture, for example by way of implant and anneal in the conventional manner as part of MOS processes 45. This processing to form n-type well 12 and any such p-type wells will typically include the appropriate mask and photolithography processes to define the locations at which these wells are formed. MOS processes 45 also incorporate the thermal oxidation or deposition of the appropriate gate dielectric material, deposition of the gate electrode layer (e.g., polysilicon), and photolithographic patterning and etching to define the gate electrodes within the integrated circuit. It is contemplated that those skilled in the art having reference to this specification will be able to arrange the sequence of processes so as to form the necessary well regions for bipolar transistor 20, as well as MOS transistor elements as compatible with the manufacturing process flow for transistor 20.

In process 46, emitter n+ region 13e and collector n+ region 13c, and base p+ region 14, are implanted and annealed in the conventional manner, by way of masked implants to select the particular active regions (i.e., those locations of the surface between isolation dielectric structures 15) that are to receive implants of the desired conductivity type. If transistor 20 is being formed in the same integrated circuit as MOS transistors (particularly according to a CMOS technology in which both n-channel and p-channel MOS transistors are fabricated), implant process 46 may be performed simultaneously with the implanting of the source and drain regions of those MOS transistors. In that event, process 46 may also includes the deposition and anisotropic etch of the appropriate material for sidewall filaments, by way of which the ion implantation of so-called lightly-doped drain regions and other steps involved in establishing the desired source/drain dopant are performed.

The construction of the integrated circuit including transistor 20 is then completed in the conventional manner, including the deposition of interlevel dielectric 24 in one or more layers as described, and the patterned etch of contact openings 19 through that interlevel dielectric 24 at the locations as shown in FIGS. 2a and 2b and elsewhere in the integrated circuit, all in process 48. In process 50, metal or other conductive material is then deposited, patterned, and etched in order to form the first level metal conductors including conductors 18e, 18b, 18c for making contact through contact openings 19 to emitter n+ region 13e, base p+ region 18b, and collector n+ region 13c, respectively. As described above, metal deposition and etch process may include the combination of the formation of conductive plugs of one material within contact openings 19, followed by the deposition of a second material to define the laterally extending conductors 18 above interlevel dielectric 24. Alternatively, conductors 18 may be formed form a single deposited metal layer that extends into contact openings. In either case, it is contemplated that the metal from which electrodes 18 are formed may include or constitute copper metallization deposited in a relatively thick layer, considering that the effects of charging during the plasma etch of that copper metallization are mitigated by the fluorine implant prior to deposition of the material of those isolation dielectric structures 15, according to this embodiment of the invention.

Additional metal levels, interlevel dielectric layers, and contact/via openings are similarly performed to fabricate the conductor routing within the integrated circuit as desired for the circuit function. Following manufacture in wafer form, conventional wafer-level test, packaging, and final test processes and the like are performed to complete the integrated circuit.

The embodiment of the invention described above applied to the formation of isolation dielectric structures 15 as shallow trench isolation structures, as is now popular in modern integrated circuit technology. However, it is contemplated that this invention may be applied to manufacturing processes and transistor structures that use other types of isolation dielectric techniques, including by way of local oxidation of silicon (LOCOS) as will now be described in connection with FIGS. 5 and 6, according to another embodiment of the invention.

Figure 5:
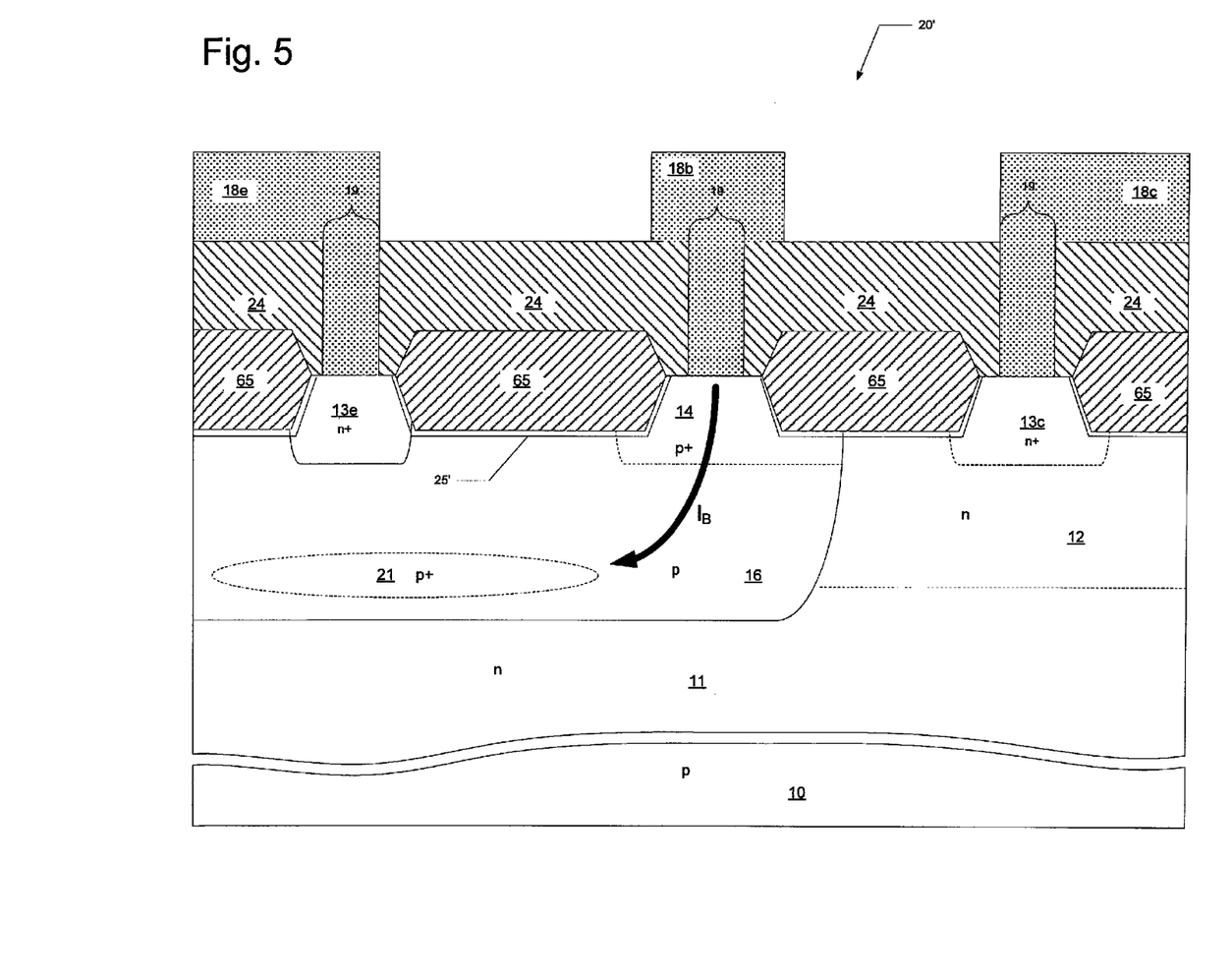
FIG. 5 is a cross-sectional view of a bipolar transistor structure constructed according to another embodiment of the invention.

FIG. 5 illustrates, in cross-section, the construction of transistor 20' according to this alternative embodiment of the invention. The same elements of transistor 20 described above relative to FIGS. 2a and 2b are shown in FIG. 5 for transistor 20' by reference to the same reference numerals. Transistor 20' of FIG. 5 differs from transistor 20 in that its isolation dielectric structures 65 are formed as LOCOS field oxide structures. As fundamental in the art, LOCOS field oxide is formed by thermal oxidation of exposed locations of the silicon surface of the structure. As such, isolation dielectric structures 65 extend above the surface of the neighboring active regions 13e, 14, 13c, extending into the underlying silicon to the extent that the oxidation consumed silicon atoms, as known in the art.

According to this embodiment of the invention, a fluorine implant is performed prior to the thermal oxidation of isolation dielectric structures 65. As described above, this fluorine implant is contemplated to affect the portions of the underlying silicon, for example at regions 25' of FIG. 5. It is believed, in connection with this invention, that these implanted fluorine ions effectively "seal" silicon-oxide interface dangling bonds that may form charge trapping sites during long duration plasma etch processes, such as required to etch metal conductors 18e, 18b, 18c formed of copper metal.

Figure 6:
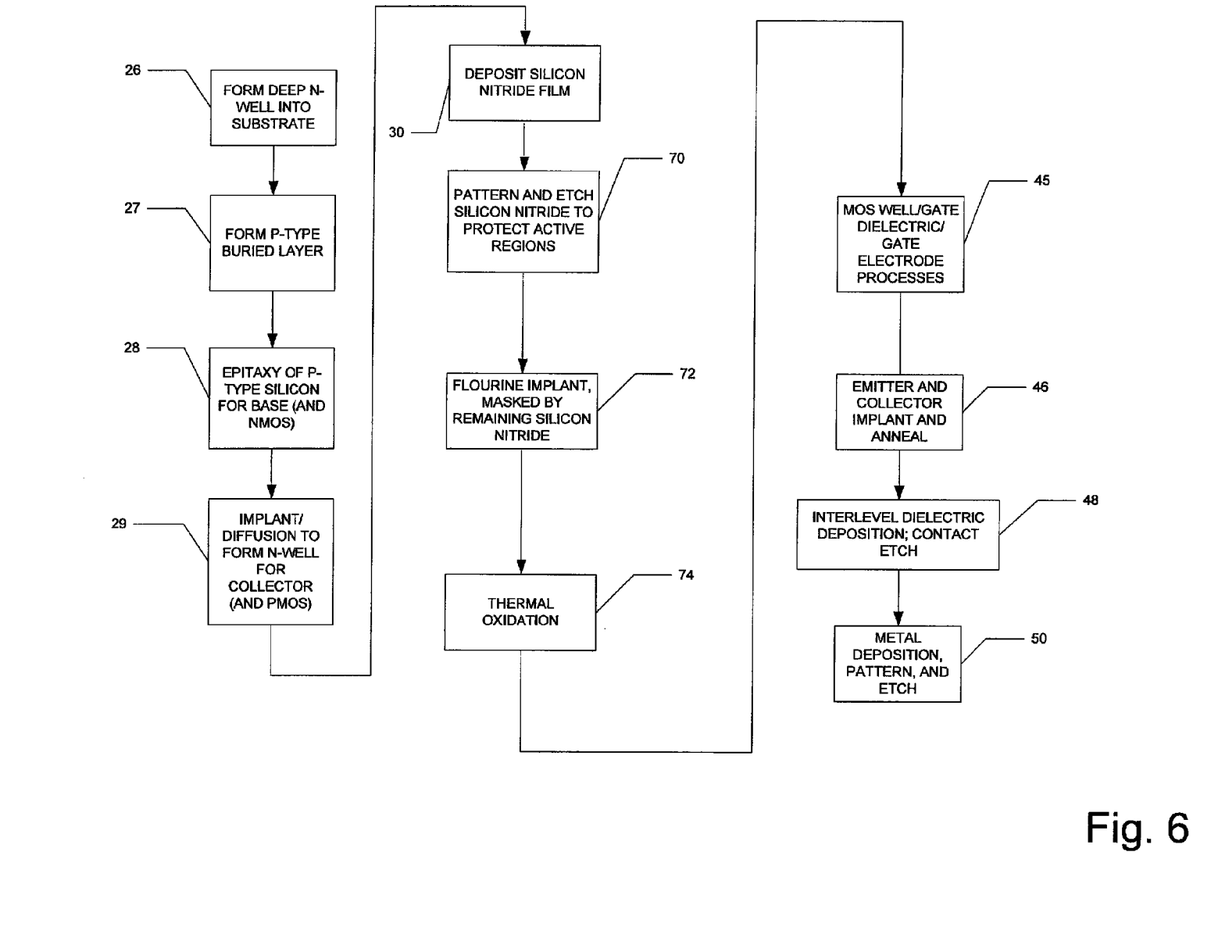
FIG. 6 is a flow diagram illustrating a process of fabricating an integrated circuit including the transistor of FIG. 5 according to that embodiment of the invention.

FIG. 6 illustrates a process flow for a method of fabricating transistor 20' according to this embodiment of this invention, as will now be described in detail. Those steps in the process flow of FIG. 6 that are the same as those described above relative to FIG. 3 are indicated by the same reference numerals. According to this embodiment of the invention, processes 26, 27, 28, 29 are performed as described above, to form p-type buried layer 21 and deep n-well 11 into p-type substrate 10, to epitaxially grow p-type silicon for base region 16, and also to form n-type well 12 in this embodiment of the invention. And in process 30, a layer of silicon nitride film is then deposited overall.

In process 70, according to this embodiment of the invention, the silicon nitride film deposited in process 30 is patterned and etched to expose those portions of the silicon surface at which isolation dielectric structures 65 are to be formed, and to protect those portions of the silicon surface at which active regions (e.g., n+ regions 13e, 13c, p+ regions 14) are desired. This patterned silicon nitride layer serves as a mask for the ion implantation of fluorine ions in process 72, blocking this fluorine implant from impacting the active surface at the locations protected by this silicon nitride layer. As described above, the fluorine implant of process 72 may be normal to the surface of substrate 10 as shown in FIG. 4d, or may be at an angle (e.g., 30° to 45°) from the normal as shown in FIG. 4e, or may be a combination of the two (i.e., two separate implants, with one angled). By way of example, the implant of process 72 may be at a dose of fluorine on the order of $2 \times 10^{15}/cm^2$, at an energy on the order of 2 to 5 keV, possibly ranging as high as 10 keV. A liner layer may be in place over the exposed portions of the surface prior to the implant of process 72, if desired for control of the fluorine implant distribution. A high temperature anneal of the structure may be performed following the fluorine implant of process 72, as appropriate.

As known in the art, silicon nitride is an effective block for the thermal oxidation of silicon. According to this embodiment of the invention, the patterned and etched silicon nitride layer deposited in process 30 may remain in place following fluorine implant 72, and thus define the location of both the fluorine implant and isolation dielectric structures 65. Alternatively, a separate silicon nitride layer may be deposited, patterned, and etched at this point to define the locations of isolation dielectric structures 65, protecting the eventual active regions of the structure. In either case, thermal oxidation process 74 is then performed by heating the structure in an oxygen-bearing atmosphere in the conventional manner for LOCOS oxidation, at the desired temperature and for the desired duration. Following thermal oxidation process 74, isolation dielectric structures 65 are in place at the surface of the structure, essentially as shown in FIG. 5.

Processes 45, 46, 48, 50 are then performed in the manner described above to complete the fabrication of transistor 20' according to this embodiment of the invention. Similarly as described above, this processing is also compatible with the fabrication of MOS transistors (both n-channel and p-channel) elsewhere in the integrated circuit if desired.

Embodiments of this invention thus enable the fabrication of an integrated circuit utilizing relatively thick metallization (e.g., copper) that includes bipolar transistors with excellent forward-active current gain, and reduced device-to-device variation of forward-active current gain and base-emitter voltage. The undesirable effects of plasma charging during plasma etch processes of relatively long duration, such as are required for the etch of relatively thick copper-bearing metallization, are mitigated by a fluorine implant prior to formation of the isolation dielectric structure separating the surface locations of the base and emitter regions. Embodiments of this invention are applicable to various types of isolation dielectric structures, including silicon dioxide structures formed by LOCOS and as shallow trench isolation structures. The manufacturing process of bipolar transistors according to embodiments of this invention can be realized in a manner that is compatible with, and efficiently implemented into, the manufacture of MOS transistors in the same integrated circuit.

While the present invention has been described according to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. A method of fabricating a bipolar transistor at a semiconducting surface of an integrated circuit body, comprising the steps of:
   forming an implant block layer overlying the surface, the implant block layer having an opening exposing a selected portion of the moat region;
   implanting fluorine ions into the exposed portion of the moat region;
   then forming an isolation dielectric structure at the implanted location of the moat region;
   forming a base region of a first conductivity type extending into the surface at the location of the isolation dielectric structure, and extending to the surface along one side of the isolation dielectric structure when formed;
   forming an emitter region of a second conductivity type into the surface along another side of the isolation dielectric structure; and
   forming conductors in contact with the base region and the emitter region.

2. The method of claim 1, further comprising:
   prior to the implanting step, forming an isolation trench into the surface at the selected location of the surface;
   wherein the implanting step implants fluorine ions into the isolation trench;
   and wherein the step of forming an isolation dielectric structure comprises:
   depositing an insulating material into the isolation trench to form the isolation dielectric structures therein.

3. The method of claim 2, further comprising:
   chemical mechanical polishing the integrated circuit body after the step of depositing an insulating material into the one or more isolation trenches, to planarize the surfaces of the one or more isolation structures.

4. The method of claim 3, wherein the chemical-mechanical polishing step also removes the implant block layer.

5. The method of claim 2, wherein the implanting step comprises:
   implanting fluorine ions into the one or more isolation trenches substantially perpendicularly relative to the surface.

6. The method of claim 2, wherein the implanting step comprises:
   implanting fluorine ions into the one or more isolation trenches at a substantial angle from the perpendicular to the surface.

7. The method of claim 1, further comprising:
   forming an oxidation mask layer comprising silicon nitride at the surface, the mask layer having an opening exposing at least a portion of the selected portion of the surface;
   wherein the step of forming an isolation dielectric structure comprises:
   thermally oxidizing the surface to form the isolation dielectric structure at the location of the opening of the oxidation mask layer.

8. The method of claim 7, wherein the implanting step is performed after the step of forming the oxidation mask layer, so that the implant block layer comprises the oxidation mask layer.

9. The method of claim 1, wherein the step of forming conductors comprises:
   depositing a metal layer overall;
   photolithographically patterning a mask layer to protect portions of the metal layer corresponding to the conductors, at least one of the conductors to be electrically connected to the emitter region and at least one of the conductors to be electrically connected to the base region; and
   then etching the metal layer in a plasma to remove portions of the metal layer exposed by the patterned mask layer.

10. The method of claim 9, wherein the metal layer comprises copper.

11. The method of claim 1, further comprising:
    after the step of implanting fluorine ions into the one or more isolation trenches, annealing the integrated circuit body.

12. A bipolar transistor at a semiconducting surface of an integrated circuit body, fabricated according to a method comprising the steps of:
    forming an implant block layer overlying the surface, the implant block layer having an opening exposing a selected portion of the moat region;
    implanting fluorine ions into the exposed portion of the moat region;

then forming an isolation dielectric structure at the implanted location of the moat region;

forming a base region of a first conductivity type extending into the surface at the location of the isolation dielectric structure, and extending to the surface along one side of the isolation dielectric structure when formed;

forming an emitter region of a second conductivity type into the surface along another side of the isolation dielectric structure; and forming conductors in contact with the base region and the emitter regions.

13. The transistor of claim 12, wherein the method further comprises:

prior to the implanting step, forming an isolation trench into the surface at the selected location of the surface;

wherein the implanting step implants fluorine ions into the isolation trench;

and wherein the step of forming an isolation dielectric structure comprises:

depositing an insulating material into the isolation trench to form the isolation dielectric structures therein.

14. The transistor of claim 13, wherein the method further comprises:

chemical mechanical polishing the integrated circuit body after the step of depositing an insulating material into the one or more isolation trenches, to planarize the surfaces of the one or more isolation structures.

15. The transistor of claim 13, wherein the implanting step comprises:

implanting fluorine ions into the one or more isolation trenches substantially perpendicularly relative to the surface.

16. The transistor of claim 13, wherein the implanting step comprises:

implanting fluorine ions into the one or more isolation trenches at a substantial angle from the perpendicular to the surface.

17. The transistor of claim 12, wherein the method further comprises forming an oxidation mask layer comprising silicon nitride at the surface, the mask layer having an opening exposing at least a portion of the selected portion of the surface;

wherein the step of forming an isolation dielectric structure comprises:

thermally oxidizing the surface to form the isolation dielectric structure at the location of the opening of the oxidation mask layer.

18. The transistor of claim 17, wherein the implanting step is performed after the step of forming the oxidation mask layer, so that the implant block layer comprises the oxidation mask layer.

19. The transistor of claim 12, wherein the step of forming conductors comprises:

depositing a metal layer overall;

photolithographically patterning a mask layer to protect portions of the metal layer corresponding to the conductors, at least one of the conductors to be electrically connected to the emitter region and at least one of the conductors to be electrically connected to the base region; and then etching the metal layer in a plasma to remove portions of the metal layer exposed by the patterned mask layer.

20. The transistor of claim 19, wherein the metal layer comprises copper.

* * * * *